(12) United States Patent
Jia

(10) Patent No.: US 10,777,755 B2
(45) Date of Patent: Sep. 15, 2020

(54) COMPOUND ADHESIVE STRUCTURE AND A DISPLAY PANEL

(71) Applicant: Wuhan China Star Optoelectronics Semiconductor Display Technology Co., Ltd., Wuhan, Hubei (CN)

(72) Inventor: Yongzhen Jia, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 182 days.

(21) Appl. No.: 16/009,737

(22) Filed: Jun. 15, 2018

(65) Prior Publication Data
US 2019/0237686 A1 Aug. 1, 2019

Related U.S. Application Data

(63) Continuation of application No. PCT/CN2018/079121, filed on Mar. 15, 2018.

(30) Foreign Application Priority Data

Jan. 26, 2018 (CN) .......................... 2018 1 0079060

(51) Int. Cl.
*H01L 51/00* (2006.01)
*B32B 7/12* (2006.01)

(52) U.S. Cl.
CPC ............ *H01L 51/0097* (2013.01); *B32B 7/12* (2013.01); *B32B 2457/20* (2013.01); *H01L 2251/5338* (2013.01)

(58) Field of Classification Search
CPC .... H01L 51/0097; B32B 7/12; B32B 2457/20
See application file for complete search history.

(56) References Cited

FOREIGN PATENT DOCUMENTS

| CN | 1632653 A | 6/2005 |
|---|---|---|
| CN | 103985321 | 8/2014 |
| CN | 107216819 | 9/2017 |

OTHER PUBLICATIONS

Derwent Abstract of KR 2010104760. Bae et al., Sep. 29, 2010 (Year: 2010).*

(Continued)

*Primary Examiner* — Victor S Chang
(74) *Attorney, Agent, or Firm* — Leong C. Lei

(57) ABSTRACT

A compound adhesive structure for bonding film layers of a display panel is disclosed. The compound adhesive structure includes an optical adhesive body; multiple flexible enhancement bodies which is disposed on a surface of the optical adhesive body and/or inside the optical adhesive body, wherein each of the flexible enhancement bodies includes a large end and a small end which is gradually narrowing in cross section from the large end; wherein a refractive index of each of the flexible enhancement bodies is similar to a refractive index of the optical adhesive body, and a density of each of the flexible enhancement bodies is similar to a density of the optical adhesive body. The present invention can suppress and break a viscosity flowing of the optical adhesive in the bending and deformation process of the display panel, and improve a wrinkle phenomenon in the bending process of the display panel.

19 Claims, 4 Drawing Sheets

(56) References Cited

OTHER PUBLICATIONS

Derwent Abstract of CN 109166461. Ao et al., Sep. 30, 2018 (Year: 2018).*
PCT/CN2018/079121, Jun. 28, 2018 (Year: 2018).*

* cited by examiner

# COMPOUND ADHESIVE STRUCTURE AND A DISPLAY PANEL

CROSS REFERENCE

This application is a continuing application of PCT Patent Application No. PCT/CN2018/079121, entitled "COMPOUND ADHESIVE STRUCTURE AND A DISPLAY PANEL", filed on Mar. 15, 2018, which claims priority to China Patent Application No. CN 201810079060.5 filed on Jan. 26, 2018, both of which are hereby incorporated in its entireties by reference.

FIELD OF THE INVENTION

The present invention relates to a manufacturing field for a compound adhesive structure, and more particularly to a compound adhesive structure and display panel.

BACKGROUND OF THE INVENTION

Flexible display technology is a main display technology of next generation. An OLED flexible display technology has advantages of good impact resistance, light weight, foldable, small occupied space, easy to carry such that the OLED flexible display technology has become an important research direction of the future display technology. Film layers of the flexible display panel usually adopt an OCA (Optically Clear Adhesive) for bonding together. Because the OCA has a viscoelasticity and poor compressibility, in the bending process, a viscous flow of the adhesive is easily to generate to form a wavy protrusion on a surface such that a wrinkle phenomenon is generated at the display panel so as to affect the display effect.

SUMMARY OF THE INVENTION

The technology problem solved by the present invention is to provide a compound adhesive structure and a display panel, which can suppress and break a viscosity flowing of the optical adhesive in the bending and deformation process of the display panel, and improve a wrinkle phenomenon in the bending process of the display panel.

In order to solve the above technology problem, the embodiment of the present invention provides a compound adhesive structure for bonding film layers of a display panel, comprising: an optical adhesive body; multiple flexible enhancement bodies which is disposed on a surface of the optical adhesive body and/or inside the optical adhesive body, wherein each of the flexible enhancement bodies includes a large end and a small end which is gradually narrowing in cross section from the large end; wherein a refractive index of each of the flexible enhancement bodies is similar to a refractive index of the optical adhesive body, and a density of each of the flexible enhancement bodies is similar to a density of the optical adhesive body.

Wherein the flexible enhancement body is conical and/or pyramidal.

Wherein the flexible enhancement body is a cone having a top platform and/or a pyramid having a top platform.

Wherein the flexible enhancement body can restore an initial shape after a deformation.

Wherein a material of the flexible enhancement body includes a porous polymer material or a hollow electrode material.

Wherein a size of the flexible enhancement body is less than or equal to 10 micrometer.

Wherein the multiple flexible enhancement bodies are embedded on the surface of the optical adhesive body and/or into the optical adhesive body through any method of an inkjet printing, a chemical vapor deposition and a vacuum sputtering.

In order to solve the above technology problem, the embodiment of the present invention provides a compound adhesive structure for bonding film layers of a display panel, comprising: an optical adhesive body; multiple flexible enhancement bodies which is disposed on a surface of the optical adhesive body and/or inside the optical adhesive body, wherein each of the flexible enhancement bodies includes a large end and a small end which is gradually narrowing in cross section from the large end; wherein a refractive index of each of the flexible enhancement bodies is similar to a refractive index of the optical adhesive body, and a density of each of the flexible enhancement bodies is similar to a density of the optical adhesive body; wherein a material of the flexible enhancement body includes a porous polymer material or a hollow electrode material and the flexible enhancement body can restore an initial shape after a deformation.

Wherein a size of the flexible enhancement body is less than or equal to 10 micrometer.

Wherein the multiple flexible enhancement bodies are embedded on the surface of the optical adhesive body and/or into the optical adhesive body through any method of an inkjet printing, a chemical vapor deposition and a vacuum sputtering.

Wherein the flexible enhancement body is conical and/or pyramidal.

Wherein the flexible enhancement body is a cone having a top platform and/or a pyramid having a top platform.

In order to solve the above technology problem, the embodiment of the present invention provides a display panel, comprising: a compound adhesive, multiple film layers bonded through the compound adhesive and a neutral surface among the multiple film layers; wherein the compound adhesive includes an optical adhesive body, multiple flexible enhancement bodies which is disposed on a surface of the optical adhesive body and/or inside the optical adhesive body, wherein each of the flexible enhancement bodies includes a large end and a small end which is gradually narrowing in cross section from the large end, wherein a refractive index of each of the flexible enhancement bodies is similar to a refractive index of the optical adhesive body, and a density of each of the flexible enhancement bodies is similar to a density of the optical adhesive body; wherein a direction that is gradually narrowing in cross section from the large end to the small end is directed to the neutral surface of the display panel.

Wherein an arrangement density of the flexible enhancement bodies 2 is positive proportional to a distance between the compound adhesive and the neutral surface of the display panel.

Wherein the flexible enhancement bodies are randomly distributed on the surface of the optical adhesive body and/or inside the optical adhesive body.

Wherein a material of the flexible enhancement body includes a porous polymer material or a hollow electrode material, and the multiple flexible enhancement bodies are embedded on the surface of the optical adhesive body and/or into the optical adhesive body through any method of an inkjet printing, a chemical vapor deposition and a vacuum sputtering.

Wherein a size of the flexible enhancement body is less than or equal to 10 micrometer.

Wherein the flexible enhancement body is conical and/or pyramidal.

Wherein the flexible enhancement body is a cone having a top platform and/or a pyramid having a top platform.

The compound adhesive structure and a display panel provided by the embodiment of the present invention has following beneficial effects: multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end, wherein a refractive index of each of the flexible enhancement bodies is similar to a refractive index of the optical adhesive body, and a density of each of the flexible enhancement bodies is similar to a density of the optical adhesive body. The present invention can suppress and break a viscosity flowing of the optical adhesive in the bending and deformation process of the display panel, and improve a wrinkle phenomenon in the bending process of the display panel.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
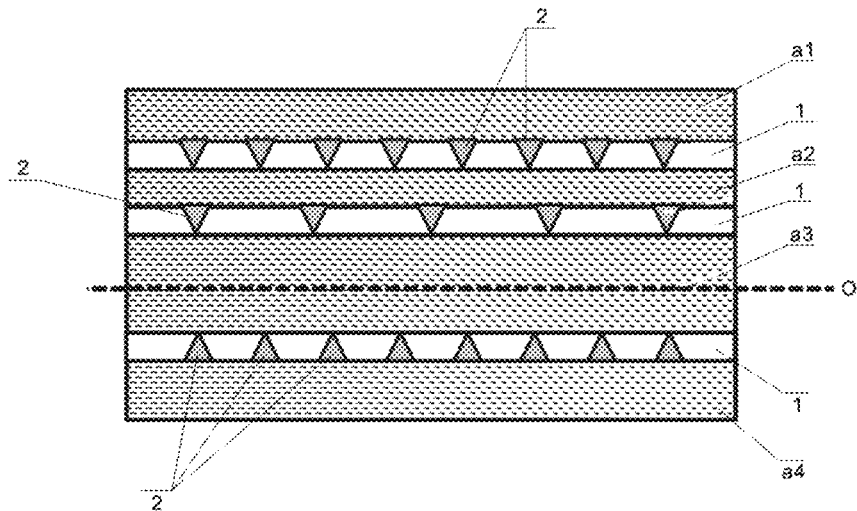
FIG. 1 is a schematic diagram of a cross-sectional view of a compound adhesive structure according an embodiment of the present invention.
Figure 2:
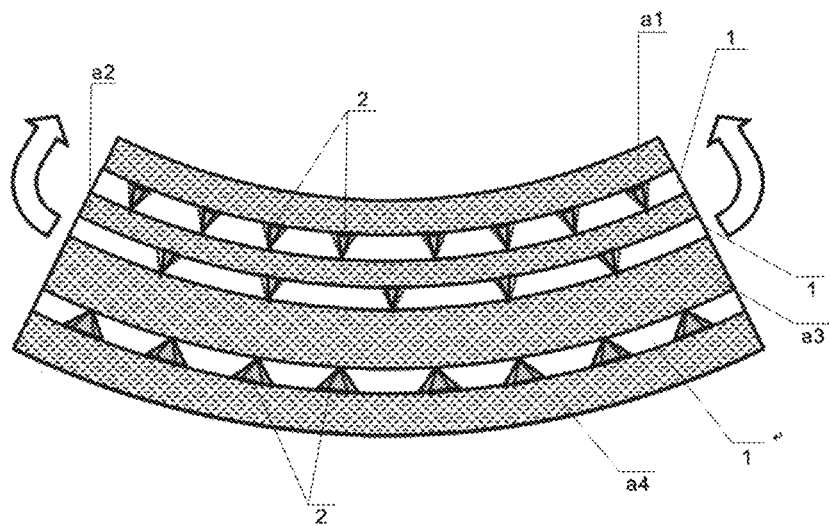
FIG. 2 is a schematic diagram of a compound adhesive structure under a bending status according to an embodiment of the present invention.
Figure 3:
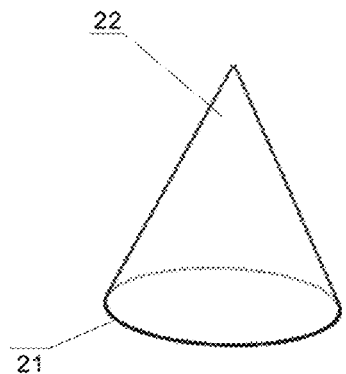
FIG. 3 is a schematic diagram of a flexible enhancement body of a compound adhesive structure according a first embodiment of the present invention.

As when in FIG. 1-FIG. 3, which are a first embodiment of the compound adhesive material display panel of the present invention.

The compound adhesive material display panel in the present embodiment includes: multiple film layers a1, a2, a3 and a4. The specific number of the film layers is not limited. Among the multiple film layers a1, a2, a3 and a4, a neutral surface O of a smallest deformation of the display panel under a bending status is existed.

Furthermore, the multiple film layers a1, a2, a3 and a4 are sequentially bonded through optical adhesive layer. Wherein the function of the optical adhesive layer is to bond the film layers and the optical adhesive layer includes: an optical adhesive body 1, multiple flexible enhancement bodies 2 which are disposed on a surface of the optical adhesive body 1 and/or inside the optical adhesive body 1, and are arranged in a preset direction. Wherein, the optical adhesive body 1 is the same or similar to the material of the optically clear adhesive for bonding the film layers in the conventional art.

The multiple flexible enhancement bodies 2 are embedded on the surface of the optical adhesive body 1 and/or into the optical adhesive body 1 through any one method of an inkjet printing, a chemical vapor deposition and a vacuum sputtering. A refractive index of each of the flexible enhancement bodies 2 is similar to a refractive index of the optical adhesive body 1. A density of each of the flexible enhancement bodies 2 is similar to a density of the optical adhesive body 1 so that the flexible enhancement bodies 2 will not affect an optical display performance of the compound adhesive structure.

Furthermore, each of the flexible enhancement bodies 2 includes a large end 21 and a small end 22 which is gradually narrowing in cross section from the large end 21. The flexible enhancement bodies 2 are randomly distributed on the surface of the optical adhesive body 1 and/or inside the optical adhesive body 1. Besides, the flexible enhancement bodies 2 can also regularly arrange on the surface of the optical adhesive body 1 and/or inside the optical adhesive body 1. The only requirement is that an overall distribution of the flexible enhancement bodies 2 has a macroscopic uniformity.

In the present embodiment, the function for disposing the flexible enhancement bodies 2 on the surface of the optical adhesive body 1 and/or inside the optical adhesive body 1 is: suppressing a viscosity flowing of the optical adhesive body 1 in order to eliminate a wrinkle phenomenon in the bending process of the display panel, improve a display effect at a flexible bending region, improve an user experience of the flexible display panel.

Furthermore, the flexible enhancement body 2 is conical, and including a large end 21 and a small end 22 which is gradually narrowing in cross section from the large end 21. Wherein the flexible enhancement body 2 is a cross section changeable structure. The large end 21 mainly sustains a horizontal stretching and a compression deformation of the film layers a1, a2, a3 and a4, and breaks a stress transfer among the film layers, eliminates a wrinkle phenomenon in the bending process of the display panel, and improves a display effect at a flexible bending region.

Preferably, an elastic modulus and a Poisson's ratio of the flexible enhancement body 2 are lower such that after a deformation, the flexible enhancement body 2 can restore an initial shape. The material of the flexible enhancement body 2 includes but not limited to a porous polymer material or a hollow electrode material.

Preferably, the preset arrangement of the flexible enhancement body 2 means: a direction that is gradually narrowing in cross section from the large end 21 to the small end 22 is directed to the neutral surface O of the display panel. Accordingly, in the bending process of the flexible display panel, the large end sustain the horizontal stretching and the compression deformation of the film layers a1, a2, a3 and a4, breaks the stress transfer of the film layers, eliminates a wrinkle phenomenon in the bending process of the display panel, and improve a display effect at a flexible bending region.

Preferably, an arrangement density of the flexible enhancement bodies 2 is positive proportional to a distance between the compound adhesive and the neutral surface O of the display panel. For example, an arrangement density of the flexible enhancement body 2 between the film layers and close to the neutral surface O of the display panel is lower, and an arrangement density of the flexible enhancement body 2 between the film layers and away from the neutral surface O of the display panel is higher.

Preferably, the size of the flexible enhancement body 2 is less than or equal to 10 micrometer. Accordingly, the flexible enhancement body 2 will not affect the optical display performance of the compound adhesive structure.

When the display panel having compound adhesive structure in the present embodiment is specifically operated, as shown in FIG. 2, the display panel having compound adhesive structure sustains an upward bending deformation, the flexible enhancement bodies 2 located above the neutral surface O of the display panel sustains a compression function to shrink inwardly. The flexible enhancement bodies 2 located below the neutral surface O of the display panel sustains stretching function to extend outwardly. The flexible enhancement bodies 2 release the stress sustained by the optical adhesive body 1, suppress a viscosity flowing in a same layer of the film layer in order to eliminate a wrinkle phenomenon in the bending process of the display panel, and increase the user experience of the flexible display panel.

Figure 4:
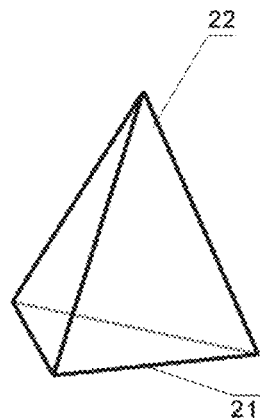
FIG. 4 is a schematic diagram of a flexible enhancement body of a compound adhesive structure according a second embodiment of the present invention.
Figure 5:
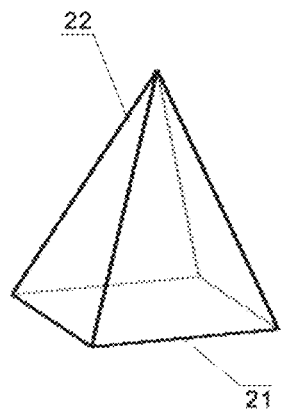
FIG. 5 is a schematic diagram of a flexible enhancement body of a compound adhesive structure according a third embodiment of the present invention.
Figure 6:
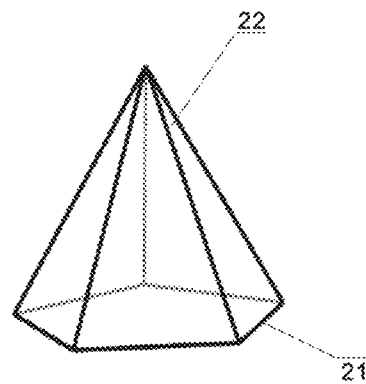
FIG. 6 is a schematic diagram of a flexible enhancement body of a compound adhesive structure according a fourth embodiment of the present invention.

In another embodiment of the compound adhesive structure of the display panel of the present invention, as shown in FIG. 4-FIG. 6, the flexible enhancement body 2 is pyramidal such as a pyramid structure of trigonal pyramid, quadrangular pyramid and pentagonal pyramid.

Figure 7:
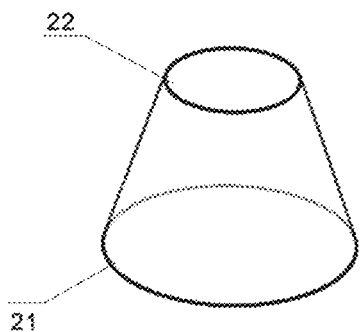
FIG. 7 is a schematic diagram of a flexible enhancement body of a compound adhesive structure according a fifth embodiment of the present invention.

The flexible enhancement body 2 can also be a cone having a top platform as shown in FIG. 7.

Figure 8:
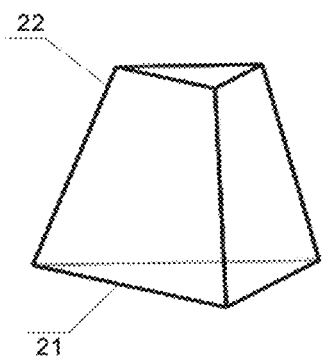
FIG. 8 is a schematic diagram of a flexible enhancement body of a compound adhesive structure according a sixth embodiment of the present invention.
Figure 9:
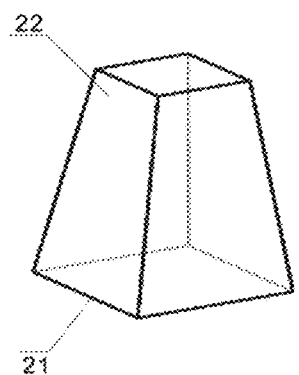
FIG. 9 is a schematic diagram of a flexible enhancement body of a compound adhesive structure according a seventh embodiment of the present invention.
Figure 10:
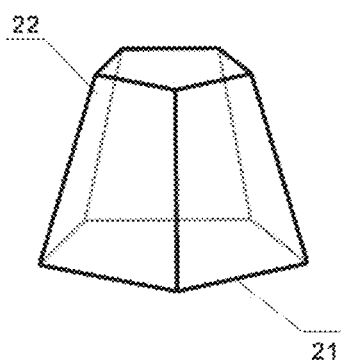
FIG. 10 is a schematic diagram of a flexible enhancement body of a compound adhesive structure according an eighth embodiment of the present invention.

The flexible enhancement body 2 can also be a pyramid having a top platform such as a trigonal pyramid having top platform, a quadrangular pyramid having top platform and a pentagonal pyramid having top platform, as shown in FIG. 8-FIG. 10. The function and the effect of the flexible enhancement body 2 of the above structure are the same as the flexible enhancement body 2 described in the first embodiment, no more repeating.

The compound adhesive structure and a display panel provided by the embodiment of the present invention has following beneficial effects: multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end, wherein a refractive index of each of the flexible enhancement bodies is similar to a refractive index of the optical adhesive body, and a density of each of the flexible enhancement bodies is similar to a density of the optical adhesive body. The present invention can suppress and break a viscosity flowing of the optical adhesive in the bending and deformation process of the display panel, and improve a wrinkle phenomenon in the bending process of the display panel.

What is claimed is:

1. A compound adhesive structure for bonding film layers of a display panel, comprising:
   an optical adhesive body;
   multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end;
   wherein a refractive index of each of the flexible enhancement bodies is similar to a refractive index of the optical adhesive body, and a density of each of the flexible enhancement bodies is similar to a density of the optical adhesive body.

2. The compound adhesive structure according to claim 1, wherein the flexible enhancement body is conical and/or pyramidal.

3. The compound adhesive structure according to claim 1, wherein the flexible enhancement body is a cone having a top platform and/or a pyramid having a top platform.

4. The compound adhesive structure according to claim 1, wherein the flexible enhancement body can restore an initial shape after a deformation.

5. The compound adhesive structure according to claim 1, wherein a material of the flexible enhancement body includes a porous polymer material or a hollow electrode material.

6. The compound adhesive structure according to claim 1, wherein a size of the flexible enhancement body is less than or equal to 10 micrometer.

7. The compound adhesive structure according to claim 1, wherein the multiple flexible enhancement bodies are embedded on the surface of the optical adhesive body and/or into the optical adhesive body through any one method of an inkjet printing, a chemical vapor deposition and a vacuum sputtering.

8. A compound adhesive structure for bonding film layers of a display panel, comprising:
   an optical adhesive body;
   multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end;
   wherein a refractive index of each of the flexible enhancement bodies is similar to a refractive index of the optical adhesive body, and a density of each of the flexible enhancement bodies is similar to a density of the optical adhesive body;
   wherein a material of the flexible enhancement body includes a porous polymer material or a hollow electrode material and the flexible enhancement body can restore an initial shape after a deformation.

9. The compound adhesive structure according to claim 8, wherein a size of the flexible enhancement body is less than or equal to 10 micrometer.

10. The compound adhesive structure according to claim 8, wherein the multiple flexible enhancement bodies are embedded on the surface of the optical adhesive body and/or into the optical adhesive body through any one method of an inkjet printing, a chemical vapor deposition and a vacuum sputtering.

11. The compound adhesive structure according to claim 8, wherein the flexible enhancement body is conical and/or pyramidal.

12. The compound adhesive structure according to claim 8, wherein the flexible enhancement body is a cone having a top platform and/or a pyramid having a top platform.

13. A display panel, comprising:
a compound adhesive, multiple film layers bonded through the compound adhesive and a neutral surface among the multiple film layers;
wherein the compound adhesive includes an optical adhesive body, multiple flexible enhancement bodies which are disposed on a surface of the optical adhesive body and/or inside the optical adhesive body and arranged along a preset direction, wherein each of the flexible enhancement bodies includes a large end and a small end which is gradually narrowing in cross section from the large end, wherein a refractive index of each of the flexible enhancement bodies is similar to a refractive index of the optical adhesive body, and a density of each of the flexible enhancement bodies is similar to a density of the optical adhesive body;
wherein a direction that is gradually narrowing in cross section from the large end to the small end is directed to the neutral surface of the display panel.

14. The display panel according to claim 13, wherein an arrangement density of the flexible enhancement bodies 2 is positive proportional to a distance between the compound adhesive and the neutral surface of the display panel.

15. The display panel according to claim 13, wherein the flexible enhancement bodies are randomly distributed on the surface of the optical adhesive body and/or inside the optical adhesive body.

16. The display panel according to claim 13, wherein a material of the flexible enhancement body includes a porous polymer material or a hollow electrode material, and the multiple flexible enhancement bodies are embedded on the surface of the optical adhesive body and/or into the optical adhesive body through any one method of an inkjet printing, a chemical vapor deposition and a vacuum sputtering.

17. The display panel according to claim 13, wherein a size of the flexible enhancement body is less than or equal to 10 micrometer.

18. The display panel according to claim 13, wherein the flexible enhancement body is conical and/or pyramidal.

19. The display panel according to claim 13, wherein the flexible enhancement body is a cone having a top platform and/or a pyramid having a top platform.

* * * * *